(12) United States Patent
Shen

(10) Patent No.: US 6,774,473 B1
(45) Date of Patent: Aug. 10, 2004

(54) SEMICONDUCTOR CHIP MODULE

(75) Inventor: Ming-Tung Shen, 4F, No. 52, Sec. 2, Chung-Shan N. Rd., Taipei (TW)

(73) Assignee: Ming-Tung Shen, Taipei (TW)

( * ) Notice: Subject to any disclaimer, the term of this patent is extended or adjusted under 35 U.S.C. 154(b) by 0 days.

(21) Appl. No.: 09/407,204

(22) Filed: Sep. 28, 1999

(30) Foreign Application Priority Data

Jul. 30, 1999 (TW) ..................................... 88212813 U

(51) Int. Cl.⁷ ......................... H01L 23/02; H01L 23/34
(52) U.S. Cl. ...................... 257/686; 257/778; 257/780; 257/723; 257/774; 257/782; 257/783
(58) Field of Search .................. 257/686, 723, 257/738, 780, 782, 783, 778, 777, 774

(56) References Cited

U.S. PATENT DOCUMENTS

| | | | | |
|---|---|---|---|---|
| 5,731,633 A | * | 3/1998 | Clayton ...................... | 257/723 |
| 5,784,264 A | * | 7/1998 | Tanioka ...................... | 361/803 |
| 5,854,507 A | * | 12/1998 | Miremadi et al. .......... | 257/686 |
| 5,977,640 A | * | 11/1999 | Bertin et al. ................ | 257/777 |
| 6,025,648 A | * | 2/2000 | Takahashi et al. .......... | 257/778 |
| 6,040,630 A | * | 3/2000 | Panchou et al. ............ | 257/783 |
| 6,051,878 A | * | 4/2000 | Akram et al. ............... | 257/686 |
| 6,069,793 A | * | 5/2000 | Maruyama et al. ......... | 361/687 |
| 6,101,100 A | * | 8/2000 | Londa ......................... | 361/761 |
| 6,137,164 A | * | 10/2000 | Yew et al. .................... | 25/686 |
| 6,153,928 A | * | 11/2000 | Cho ............................ | 257/686 |
| 6,188,127 B1 | * | 2/2001 | Senba et al. ................ | 257/686 |
| 6,229,215 B1 | * | 5/2001 | Egawa ....................... | 257/777 |

* cited by examiner

*Primary Examiner*—Steve Lofe
*Assistant Examiner*—Nitin Parekh
(74) *Attorney, Agent, or Firm*—Merchant & Gould, P.C.

(57) ABSTRACT

A semiconductor chip module includes a chip-mounting member having opposite first and second surfaces, a set of circuit traces, and a plurality of plated through holes that extend through the first and second surfaces and that are connected to the circuit traces. A dielectric tape member bonds adhesively a semiconductor chip on the chip-mounting member. A first conductor unit connects electrically contact pads on a pad mounting surface of the semiconductor chip and the circuit traces. A plurality of solder balls are disposed on one of the first and second surfaces of the chip-mounting member, are aligned with and are connected to the plated through holes in the chip-mounting member, respectively.

8 Claims, 9 Drawing Sheets

SEMICONDUCTOR CHIP MODULE

BACKGROUND OF THE INVENTION

1. Field of the Invention

The invention relates to a semiconductor chip module, more particularly to semiconductor chip modules that can be stacked one on top of the other in a fully automated manner.

2. Description of the Related Art

In this age of computer technology, there is an ever-growing need to increase the speed and functionality of computers, thereby resulting in a corresponding need to increase the memory capacity. However, due to limitations in the size of a computer main board, the number of on-board memory devices that can be installed is severely limited. There is thus a need to develop a memory device having a capacity that can be expanded without incurring a substantial increase in board penalty.

In U.S. Pat. No. 4,996,587, there is disclosed an integrated semiconductor chip package that includes a plurality of chip carriers arranged in a stack, and a plurality of semiconductor chips mounted on the chip carriers. However, due to the need for S-shaped connector clips mounted on the chip carriers to establish electrical connection among the semiconductor chips, the integrated semiconductor chip package according to the aforesaid U.S. patent cannot be manufactured in a fully automated manner, thereby resulting in increased production costs.

SUMMARY OF THE INVENTION

Therefore, the object of the present invention is to provide semiconductor chip modules that can be stacked one on top of the other in a fully automated manner.

According to one aspect of the invention, a semiconductor chip module comprises:

- a chip-mounting member having opposite first and second surfaces, a set of circuit traces, and a plurality of plated through holes that extend through the first and second surfaces and that are connected to the circuit traces;
- a semiconductor chip having a pad mounting surface with a plurality of contact pads provided thereon;
- a dielectric tape member for bonding adhesively the semiconductor chip on the chip-mounting member;
- a conductor unit for connecting electrically the contact pads of the semiconductor chip and the circuit traces; and
- a plurality of solder balls disposed on one of the first and second surfaces of the chip-mounting member, each of the solder balls being aligned with and being connected to a respective one of the plated through holes in the chip-mounting member.

According to another aspect of the invention, a semiconductor chip module stack comprises upper and lower semiconductor chip modules, each including:

- a chip-mounting member having upper and lower surfaces, a set of circuit traces, and a plurality of plated through holes that extend through the upper and lower surfaces and that are connected to the circuit traces;
- a semiconductor chip having a pad mounting surface with a plurality of contact pads provided thereon;
- a dielectric tape member for bonding adhesively the semiconductor chip on the chip-mounting member;
- a conductor unit for connecting electrically the contact pads of the semiconductor chip and the circuit traces; and
- a plurality of solder balls disposed on the lower surface of the chip-mounting member, each of the solder balls being aligned with and being connected to a respective one of the plated through holes in the chip-mounting member.

The solder balls of the upper semiconductor chip module are aligned with and are connected to the plated through holes in the chip-mounting member of the lower semiconductor chip module at the upper surface of the latter.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
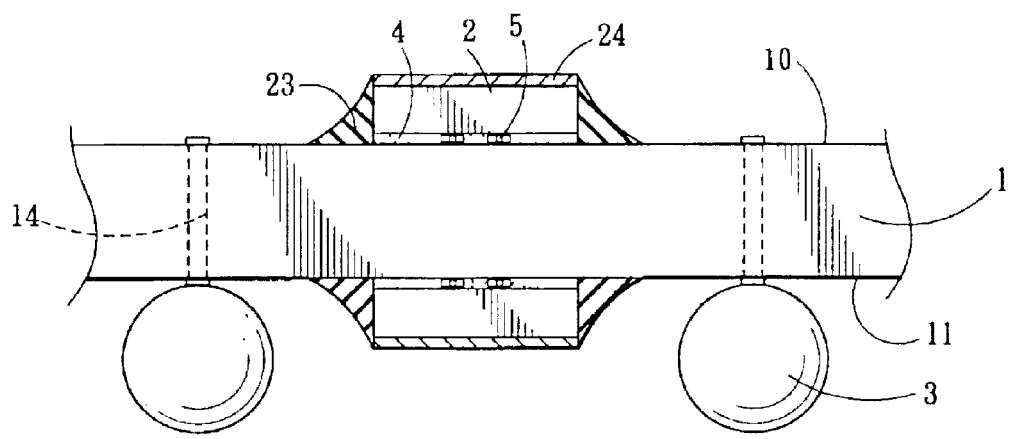
FIG. 1 is a fragmentary schematic partly sectional view of the first preferred embodiment of a semiconductor chip module according to the present invention.

Before the present invention is described in greater detail, it should be noted that like elements are denoted by the same reference numerals throughout the disclosure.

Referring to FIG. 1, the first preferred embodiment of a semiconductor chip module according to the present invention is shown to comprise a chip-mounting member 1, at least two semiconductor chips 2, and a plurality of solder balls 3.

Figure 2:
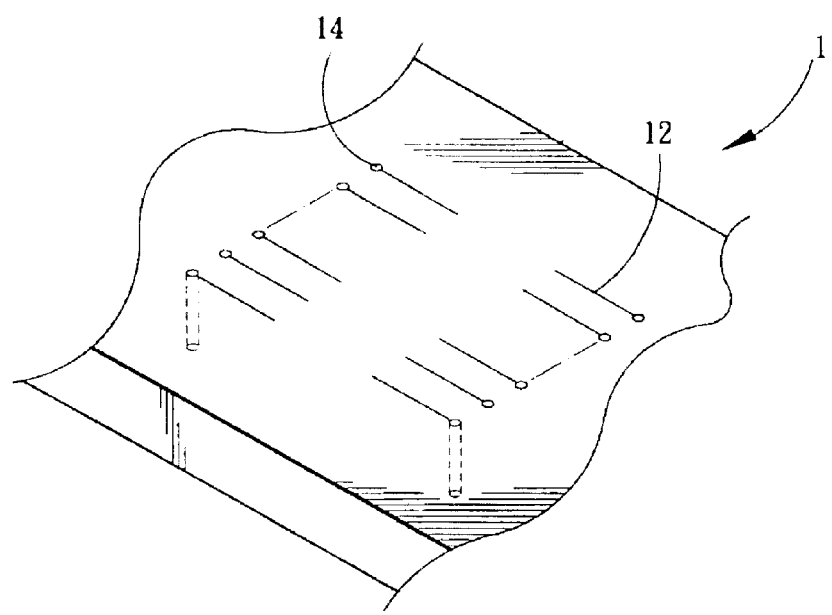
FIG. 2 is a fragmentary perspective view of a chip-mounting member of the first preferred embodiment.

In this embodiment, the chip-mounting member 1 is a board body having opposite first and second chip mounting surfaces 10, 11 that are respectively formed with circuit traces 12 (see FIG. 2). The chip-mounting member 1 is further formed with a plurality of plated through holes 14 that extend through the first and second chip mounting surfaces 10, 11 and that are connected electrically to the circuit traces 12 on the surfaces 10, 11.

Figure 3:
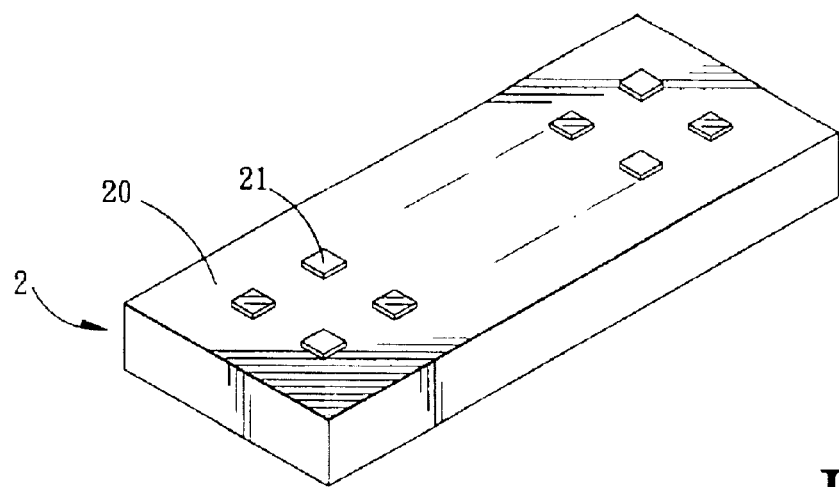
FIG. 3 is a perspective view illustrating a semiconductor chip of the first preferred embodiment.
Figure 4:
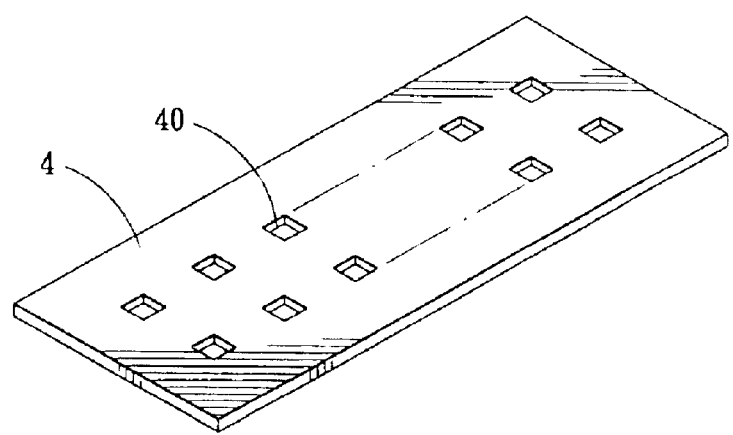
FIG. 4 is a perspective view illustrating a dielectric tape member of the first preferred embodiment.

Each of the semiconductor chips 2 has a pad mounting surface 20 with a plurality of contact pads 21 provided thereon (see FIG. 3). The pad mounting surface 20 of each of the semiconductor chips 2 is bonded adhesively on one of the first and second chip mounting surfaces 10, 11 via a dielectric tape member 4. Particularly, the dielectric tape member 4 has a first adhesive surface adhered onto the pad mounting surface 20 of the semiconductor chip 2, and an opposite second adhesive surface adhered onto the first or second chip mounting surface 10, 11. The dielectric tape member 4 is formed with a plurality of holes 40 at positions registered with the contact pads 21 of the semiconductor chip 2 (see FIG. 4). Conductive contact balls 5 are received in the holes 40 to establish electrical connection between the contact pads 21 of the semiconductor chip 2 and the circuit traces 12 on the first or second chip mounting surface 10, 11. Preferably, each semiconductor chip 2 has a peripheral portion that is provided with an epoxy resin layer 23 to strengthen bonding of the semiconductor chip 2 with the first or second chip mounting surface 10, 11. Moreover, each semiconductor chip 2 has a heat dissipating surface that is opposite to the pad mounting surface and that has a heat dissipating plate 24 secured thereon for heat dissipating and chip protection purposes.

Each of the solder balls 3 (only two are shown in FIG. 1) is made from tin and is disposed on the second chip mounting surface 11 of the chip-mounting member 1. Each of the solder balls 3 is aligned with and is connected to a respective one of the plated through holes 14 in the chip-mounting member 1. Thus, electrical connection between the solder balls 3 and the contact pads 21 of the semiconductor chips 2 can be established via the circuit traces 12 on the surfaces 10, 11 of the chip-mounting member 1.

While FIG. 1 shows only one semiconductor chip 2 mounted on each of the surfaces 10, 11 of the chip-mounting member 1, it should be clear to one skilled in the art that two or more semiconductor chips 2 may be mounted on each of the surfaces 10, 11.

Figure 5:
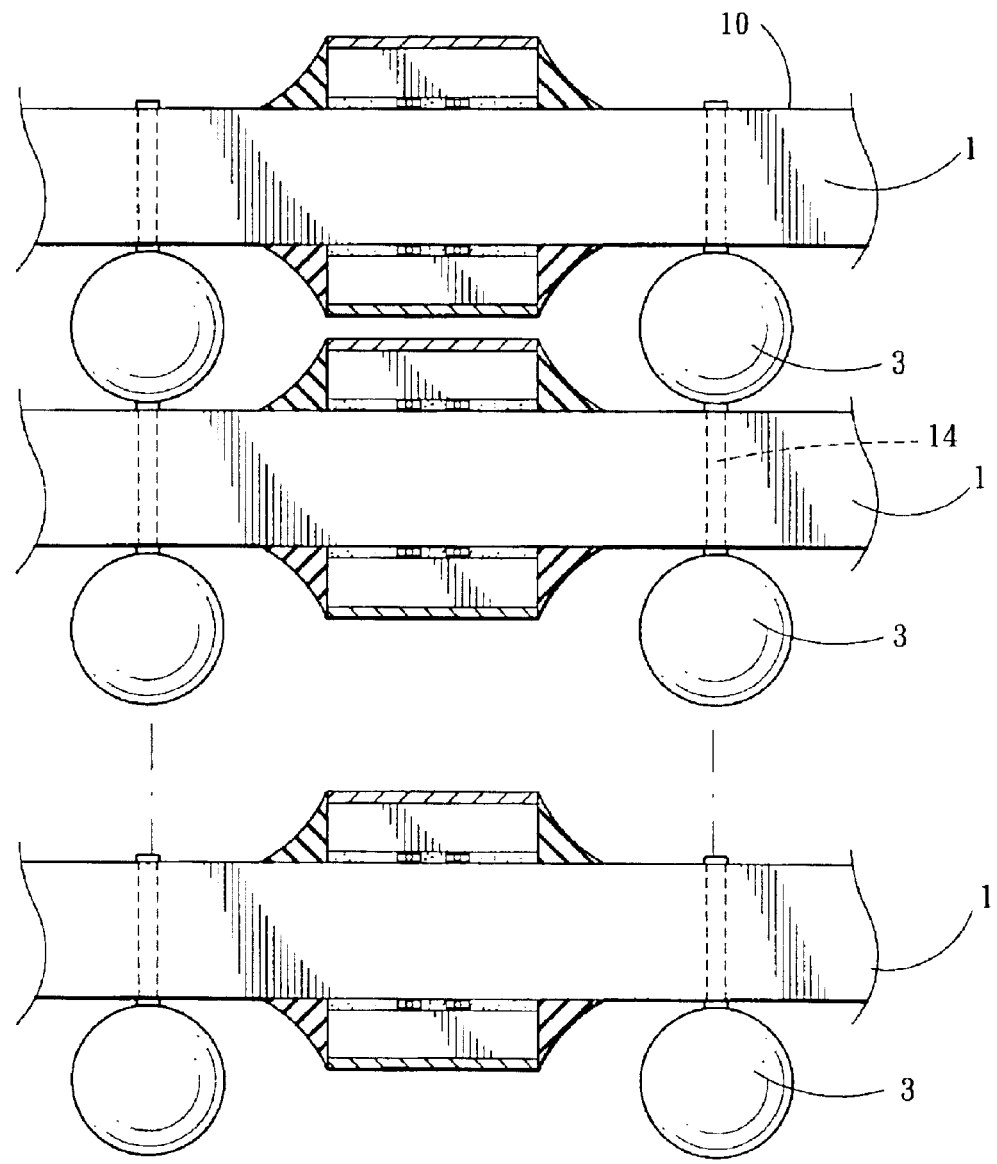
FIG. 5 is a fragmentary schematic partly sectional view illustrating how a plurality of the semiconductor chip modules of the first preferred embodiment can be interconnected to form a stack.

Referring to FIG. 5, two or more semiconductor chip modules of the first preferred embodiment can be interconnected to form a semiconductor chip module stack. As shown, the solder balls 3 on an upper one of the semiconductor chip modules are aligned with and are connected to the plated through holes 14 in the chip-mounting member 1 of a lower one of the semiconductor chip modules at the first chip mounting surface 10 of the latter. The solder balls 3 of a lowermost one of the semiconductor chip modules in the semiconductor chip module stack can be mounted on a printed circuit board (not shown) for establishing electrical connection with circuit traces on the latter.

Figure 6:
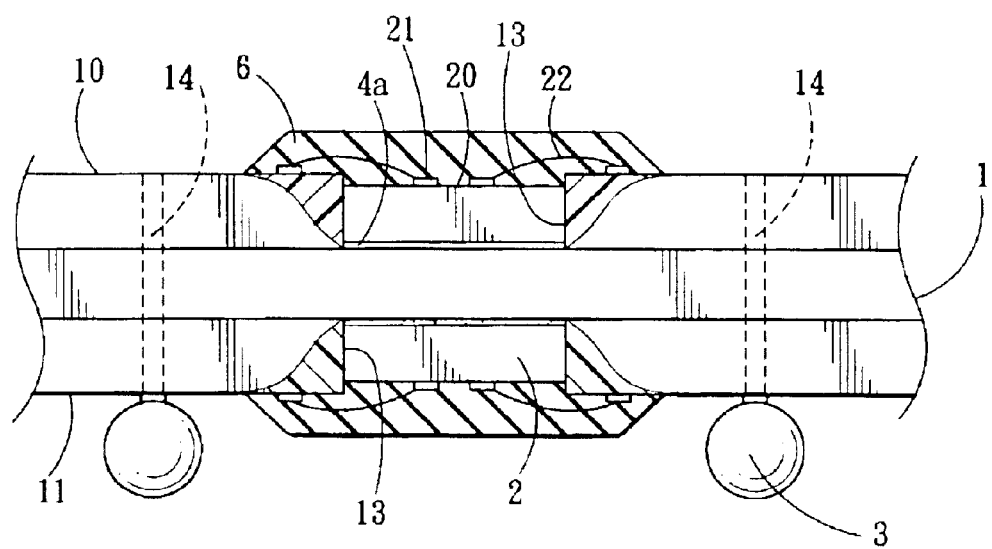
FIG. 6 is a fragmentary schematic partly sectional view of the second preferred embodiment of a semiconductor chip module according to the present invention.
Figure 7:
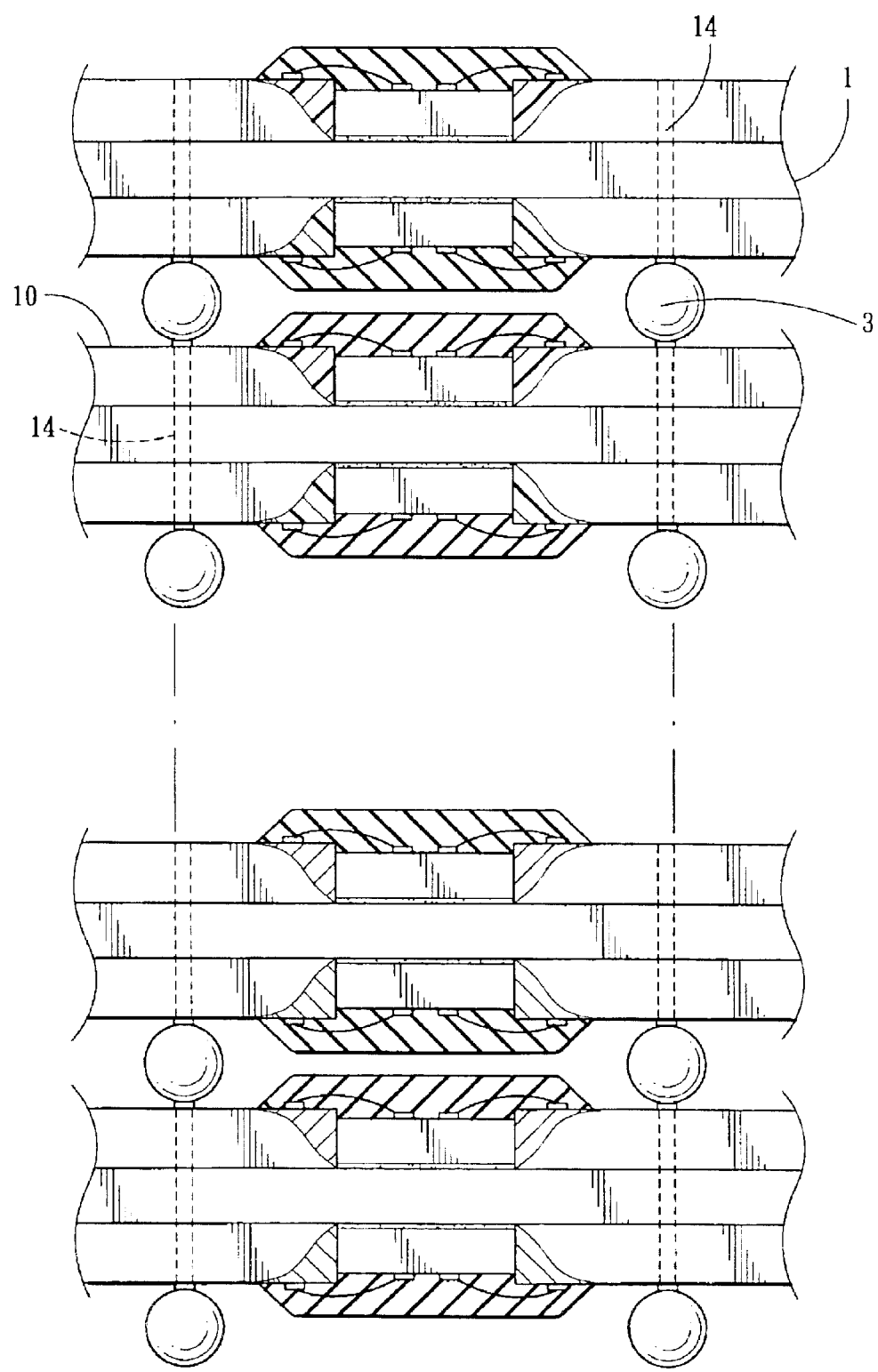
FIG. 7 is a fragmentary schematic partly sectional view illustrating how a plurality of the semiconductor chip modules of the second preferred embodiment can be interconnected to form a stack.

FIG. 6 illustrates the second preferred embodiment of a semiconductor chip module according to the present invention. As shown, the chip-mounting member 1 is a three-layer board body having opposite first and second chip mounting surfaces 10, 11 that are respectively formed with circuit traces similar to those shown in FIG. 2. The chip-mounting member 1 is further formed with a plurality of plated through holes 14 that extend through the first and second chip mounting surfaces 10, 12 and that are connected electrically to the circuit traces on the surfaces 10, 11. Each of the surfaces 10, 11 is formed with at least one chip receiving cavity 13 having an open end and a closed end opposite to the open end. Each of the semiconductor chips 2 has a pad mounting surface 20 with a plurality of contact pads 21 provided thereon, and an opposite chip fixing surface. Each of the semiconductor chips 2 is received in a respective one of the chip receiving cavities 13 in the chip-mounting member 1 with the pad mounting surface 20 being accessible from the first or second chip mounting surface 10, 11 via the open end of the respective one of the chip receiving cavities 13. The chip fixing surface of each of the semiconductor chips 2 is bonded adhesively on the closed end of the respective one of the chip receiving cavities 13 via a dielectric tape member 4a. Particularly, the dielectric tape member 4a has a first adhesive surface adhered onto the chip fixing surface of the semiconductor chip 2, and an opposite second adhesive surface adhered onto the closed end of the respective one of the chip receiving cavities 13. In addition, wires 22 interconnect the contact pads 21 of the semiconductor chip 2 and the circuit traces on the first or second chip mounting surface 10, 11. Preferably, an encapsulation layer 6, made of epoxy resin, is provided on each of the first and second chip mounting surfaces 10, 11 to enclose the pad mounting surface 20 of each semiconductor chip 2 and the wires 22 that are connected to the semiconductor chip 2 for protection purposes. Like the previous embodiment, each of the solder balls 3 is disposed on the second chip mounting surface 11 of the chip-mounting member 1, and is aligned with and is connected to a respective one of the plated through holes 14 in the chip-mounting member 1. Thus, electrical connection between the solder balls 3 and the contact pads 21 of the semiconductor chips 2 can be established via the wires 22 and the circuit traces on the surfaces 10, 11 of the chip-mounting member 1. Referring to FIG. 7, two or more semiconductor chip modules of the second preferred embodiment can be interconnected to form a semiconductor chip module stack. As shown, the solder balls 3 on an upper one of the semiconductor chip modules are aligned with and are connected to the plated through holes 14 in the chip-mounting member 1 of a lower one of the semiconductor chip modules at the first chip mounting surface 10 of the latter. The solder balls 3 of a lowermost one of the semiconductor chip modules in the semiconductor chip module stack can be mounted on a printed circuit board (not shown) for establishing electrical connection with circuit traces on the latter.

Figure 8:
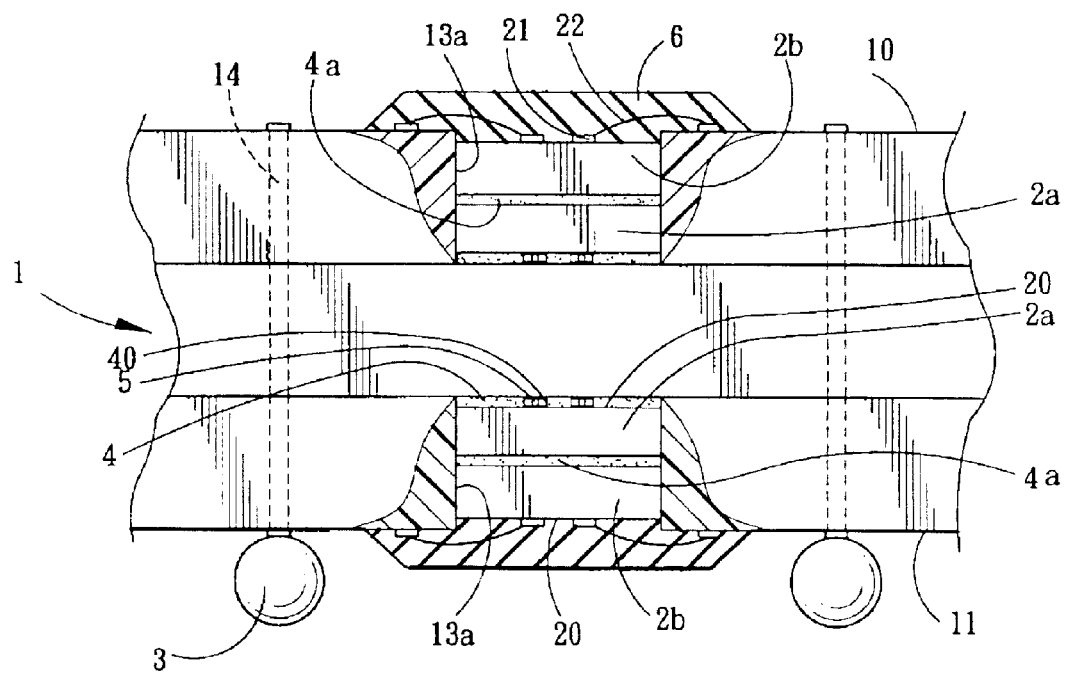
FIG. 8 is a fragmentary schematic partly sectional view of the third preferred embodiment of a semiconductor chip module according to the present invention.

FIG. 8 illustrates the third preferred embodiment of a semiconductor chip module according to the present invention. As shown, the chip-mounting member 1 is a three-layer board body having opposite first and second chip mounting surfaces 10, 11 formed with at least one chip receiving cavity 13a having an open end and a closed end opposite to the open end. The chip-mounting member 1 is further formed with a plurality of plated through holes 14 that extend through the surfaces 10, 12. The first and second chip mounting surfaces 10, 11 and the closed end of each chip receiving cavity 13a are respectively formed with circuit traces similar to those shown in FIG. 2 and connected electrically to the plated through holes 14. Each of the chip receiving cavities 13 receives two semiconductor chips 2a, 2b therein. Each of the semiconductor chips 2a, 2b has a pad mounting surface 20 with a plurality of contact pads 21 provided thereon, and an opposite chip fixing surface. The pad mounting surface 20 of each of the semiconductor chips 2a is bonded adhesively on the closed end of the respective one of the chip receiving cavities 13a via a dielectric tape layer 4. Particularly, the dielectric tape layer 4 has a first adhesive surface adhered onto the pad mounting surface 20 of the semiconductor chip 2a, and an opposite second adhesive surface adhered onto the closed end of the respective one of the chip receiving cavities 13a. Like the first preferred embodiment, the dielectric tape layer 4 is formed with a plurality of holes 40 at positions registered with the contact pads 21 of the semiconductor chip 2a. Conductive contact balls 5 are received in the holes 40 to establish electrical connection between the contact pads 21 of the semiconductor chip 2a and the circuit traces on the closed end of the respective one of the chip receiving cavities 13a. Each of the semiconductor chips 2b is received in the respective one of the chip receiving cavities 13a with the pad mounting surface 20 thereof being accessible from the first or second chip mounting surface 10, 11 via the open end of the respective one of the chip receiving cavities 13a. The chip fixing surface of each of the semiconductor chips 2b is bonded adhesively on the chip fixing surface of the semiconductor chip 2a that is disposed in the same one of the chip receiving cavities 13a via another dielectric tape layer 4a. Particularly, the dielectric tape layer 4a has a first adhesive surface adhered onto the chip fixing surface of the semiconductor chip 2b, and an opposite second adhesive surface adhered onto the chip fixing surface of the semiconductor chip 2a. In addition, like the second preferred embodiment, wires 22 interconnect the contact pads 21 of the semiconductor chip 2b and the circuit traces on the first or second chip mounting surface 10, 11. Moreover, an encapsulation layer 6, made of epoxy resin, is provided on each of the surfaces 10, 11 of the chip-mounting member 1 to enclose the pad mounting surface 20 of each semiconductor chip 2b and the wires 22 that are connected to the semiconductor chip 2b for protection purposes. As with the previous embodiments, each of the solder balls 3 is disposed on the second chip mounting surface 11, and is aligned with and is connected to a respective one of the plated through holes 14 in the chip-mounting member 1. Thus, electrical connection between the solder balls 3 and the contact pads 21 of the semiconductor chips 2a can be established via the circuit traces on the closed ends of the chip receiving cavities 13a, while electrical connection between the solder balls 3 and the contact pads 21 of the semiconductor chips 2b can be established via the wires 22 and the circuit traces on the surfaces 10, 11 of the chip-mounting member 1.

Figure 9:
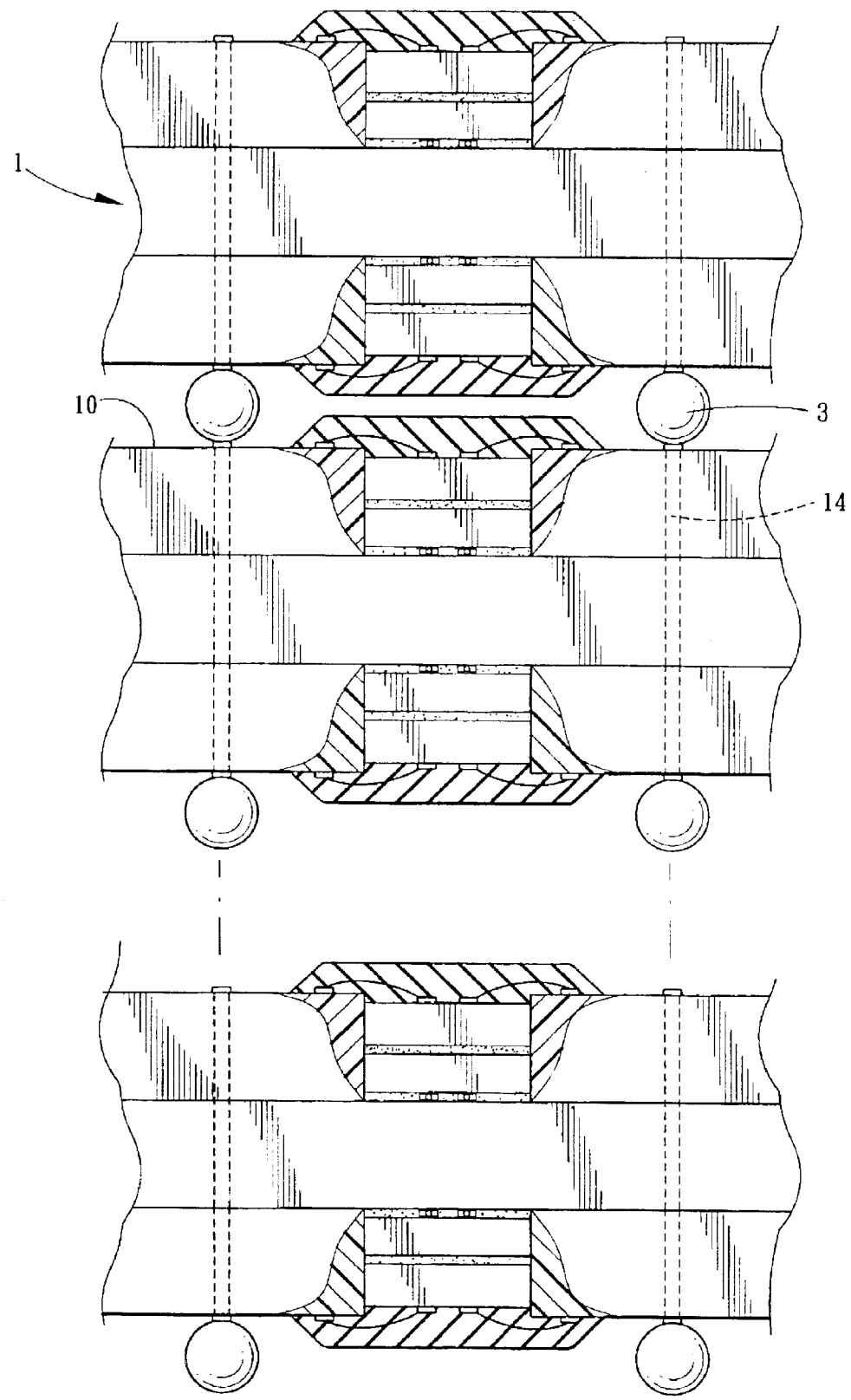
FIG. 9 is a fragmentary schematic partly sectional view illustrating how a plurality of the semiconductor chip modules of the third preferred embodiment can be interconnected to form a stack.

Referring to FIG. 9, two or more semiconductor chip modules of the third preferred embodiment can be interconnected to form a semiconductor chip module stack. As shown, the solder balls 3 on an upper one of the semiconductor chip modules are aligned with and are connected to the plated through holes 14 in the chip-mounting member 1 of a lower one of the semiconductor chip modules at the first chip mounting surface 10 of the latter. The solder balls 3 of a lowermost one of the semiconductor chip modules in the semiconductor chip module stack can be mounted on a printed circuit board (not shown) for establishing electrical connection with circuit traces on the latter.

Figure 10:
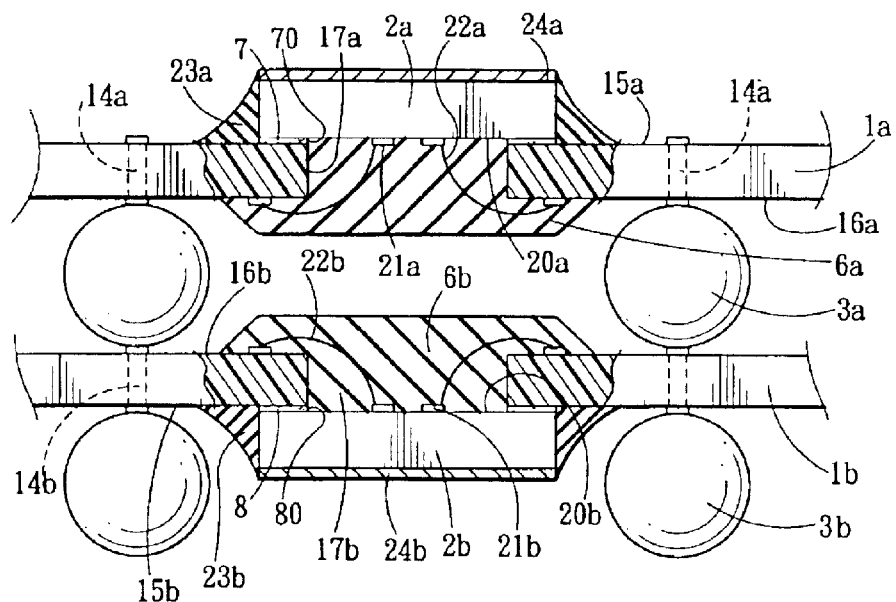
FIG. 10 is a fragmentary schematic partly sectional view of the fourth preferred embodiment of a semiconductor chip module according to the present invention.

Referring to FIG. 10, the fourth preferred embodiment of a semiconductor chip module according to the present invention is shown to comprise first and second chip-mounting members 1a, 1b, a first semiconductor chip 2a, a second semiconductor chip 2b, a plurality of first solder balls 3a, and a plurality of second solder balls 3b.

In this embodiment, the first chip-mounting member 1a is a board body having an upper chip mounting surface 15a and a lower circuit layout surface 16a formed with circuit traces similar to those shown in FIG. 2. The first chip-mounting member 1a is further formed with an opening 17a and a plurality of plated through holes 14a that extend through the surfaces 15a, 16a and that are connected electrically to the circuit traces on the circuit layout surface 16a. The first semiconductor chip 2a has a pad mounting surface 20a with a plurality of contact pads 21a provided thereon. The pad mounting surface 20a is bonded adhesively on the chip mounting surface 15a using a dielectric tape member 7. Particularly, the dielectric tape member 7 has a first adhesive surface adhered onto the pad mounting surface 20a, and an opposite second adhesive surface adhered onto the chip mounting surface 15a. The dielectric tape member 7 is formed with an opening 70 that is registered with the opening 17a such that the contact pads 21a are accessible from the circuit layout surface 16a via the openings 17a, 70. Wires 22a interconnect the contact pads 21a and the circuit traces on the circuit layout surface 16a. Preferably, a peripheral portion of the first semiconductor chip 2a is provided with an epoxy resin layer 23a to strengthen bonding of the first semiconductor chip 2a with the chip mounting surface 15a. Moreover, the first semiconductor chip 2a has a heat dissipating surface that is opposite to the pad mounting surface 20a and that has a heat dissipating plate 24a secured thereon for heat dissipating and chip protections purposes. In addition, an encapsulation layer 6a made of epoxy resin is provided on the circuit layout surface 16a to enclose the pad mounting surface 20a and the wires 22a for protection purposes. Each of the first solder balls 3a (only two are shown in FIG. 10) is made from tin and is disposed on the circuit layout surface 16a. Each of the first solder balls 3a is aligned with and is connected to a respective one of the plated through holes 14a in the first chip-mounting member 1a. Thus, electrical connection between the first solder balls 3a and the contact pads 21a of the first semiconductor chip 2a can be established via the circuit traces on the circuit layout surface 16a and the wires 22a.

Unlike the first chip-mounting member 1a, the second chip-mounting member 1b is a board body having a lower chip mounting surface 15b and an upper circuit layout surface 16b formed with circuit traces similar to those shown in FIG. 2. The second chip-mounting member 1b is further formed with an opening 17b and a plurality of plated through holes 14b that extend through the surfaces 15b, 16b and that are connected electrically to the circuit traces on the circuit layout surface 16b. The second semiconductor chip 2b has a pad mounting surface 20b with a plurality of contact pads 21b provided thereon. The pad mounting surface 20b is bonded adhesively on the chip mounting surface 15b using a dielectric tape member 8. Particularly, the dielectric tape member 8 has a first adhesive surface adhered onto the pad mounting surface 20b, and an opposite second adhesive surface adhered onto the chip mounting surface 15b. The dielectric tape member 8 is formed with an opening 80 that is registered with the opening 17b such that the contact pads 21b are accessible from the circuit layout surface 16b via the openings 17b, 80. Wires 22b interconnect the contact pads 21b and the circuit traces on the circuit layout surface 16b. Like the first semiconductor chip 2a, a peripheral portion of the second semiconductor chip 2b is provided with an epoxy resin layer 23b to strengthen bonding of the second semiconductor chip 2b with the chip mounting surface 15b. Moreover, the second semiconductor chip 2b has a heat dissipating surface that is opposite to the pad mounting surface 20b and that has a heat dissipating plate 24b secured thereon for heat dissipating and chip protection purposes. In addition, an encapsulation layer 6b made of epoxy resin is provided on the circuit layout surface 16b to enclose the pad mounting surface 20b and the wires 22b for protection purposes. Each of the second solder balls 3b (only two are shown in FIG. 10) is made from tin and is disposed on the chip mounting surface 15b. Each of the second solder balls 3b is aligned with and is connected to a respective one of the plated through holes 14b in the second chip-mounting member 1b. Thus, electrical connection between the second solder balls 3b and the contact pads 21b of the second semiconductor chip 2b can be established via the circuit traces on the circuit layout surface 16b and the wires 22b.

In this embodiment, the second chip-mounting member 1b is disposed below the first chip-mounting member 1a, and each of the first solder balls 3a on the circuit layout surface 16a of the first chip-mounting member 1a is aligned with and is connected to a respective one of the plated through holes 14b at the circuit layout surface 16a of the second chip-mounting member 1b.

Figure 11:
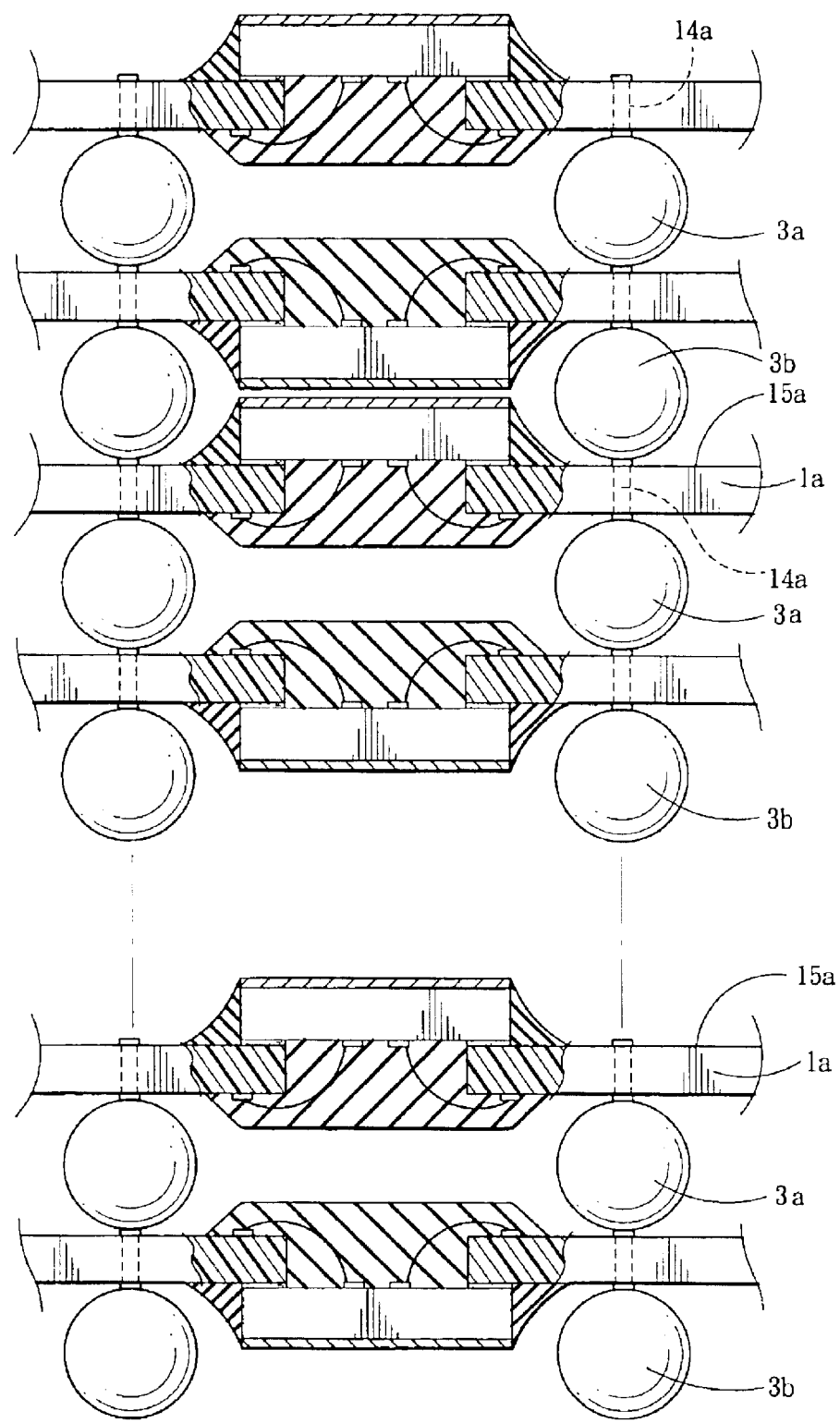
FIG. 11 is a fragmentary schematic partly sectional view illustrating how a plurality of the semiconductor chip modules of the fourth preferred embodiment can be interconnected to form a stack.

Referring to FIG. 11, two or more semiconductor chip modules of the fourth preferred embodiment can be interconnected to form a semiconductor chip module stack. As shown, the second solder balls 3b on an upper one of the semiconductor chip modules are aligned with and are connected to the plated through holes 14a at the chip mounting surface 15a of the first chip-mounting member 1a of a lower one of the semiconductor chip modules. The second solder balls 3b of a lowermost one of the semiconductor chip modules in the semiconductor chip module stack can be mounted on a printed circuit board (not shown) for establishing electrical connection with circuit traces on the latter.

Figure 12:
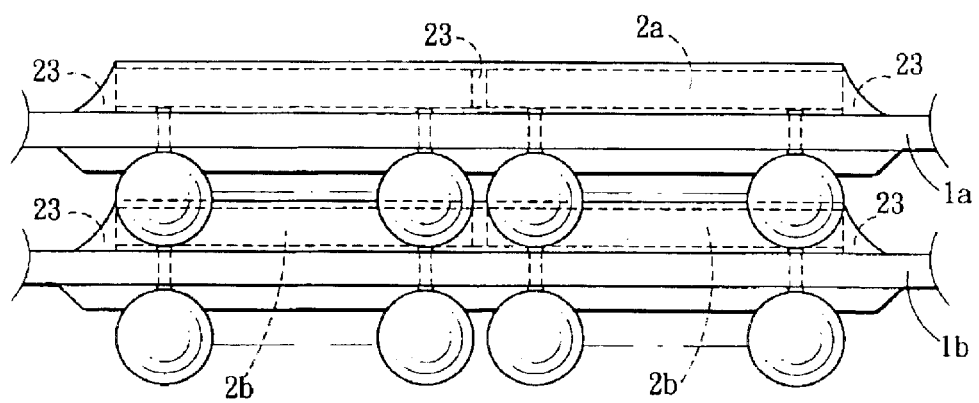
FIG. 12 is a fragmentary schematic partly sectional view of the fifth preferred embodiment of a semiconductor chip module according to the present invention.

FIG. 12 illustrates the fifth preferred embodiment of a semiconductor chip module according to the present invention. In contrast with the fourth preferred embodiment, each of the first and second chip-mounting members 1a, 1b has at least two first and second semiconductor chips 2a, 2b mounted respectively thereon.

It has thus been shown that the semiconductor chip module of this invention does not require the use of connector clips to establish electrical connection with other semiconductor chip modules. The semiconductor chip module can be manufactured in a fully automated manner to result in lower production costs. When the semiconductor chips are memory chips, a significant increase in memory capacity is possible without incurring a significant increase in board penalty. The object of the present invention is thus met.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A semiconductor chip module comprising:
   a chip-mounting member having opposite first and second surface a set of first circuit traces, and a plurality of plated through holes that extend through said first and second surfaces and that are connected to said first circuit traces;
   a first semiconductor chip having a pad mounting surface with a plurality of contact pads provided thereon;
   a first dielectric tape member for bonding adhesively said first semiconductor chip on said chip-mounting member;
   a first conductor unit for connecting electrically said contact pads of said first semiconductor chip and said first circuit traces; and a plurality of solder balls disposed on one of said first and second surfaces of said chip-mounting member, each of said solder balls being aligned with and being connected to a respective one of said plated through holes in said chip-mounting member;
   wherein said first circuit traces and said first semiconductor chip are disposed on a same one of said first and second surfaces of said chip-mounting member;
   said first dielectric tape member bonds adhesively said pad mounting surface of said first semiconductor chip on said same one of said first and second surfaces of said chip-mounting member, and is formed with a plurality of holes at positions registered with said contact pads of said first semiconductor chip; and
   said first conductor unit includes a plurality of conductive contact balls that are disposed within said holes in said first dielectric tape member to establish electrical connection between said contact pads of said first semiconductor chip and said first circuit traces.

2. The semiconductor chip module as claimed in claim 1, wherein said chip-mounting member further has a set of second circuit traces accessible from the other one of said first and second surfaces opposite to said first circuit and connected to said plated through holes, said semiconductor chip module further comprising:
   a second semiconductor chip having a pad mounting surface with a plurality of contact pads provided thereon;
   a second dielectric tape member for bonding adhesively said second semiconductor chip on said chip-mounting member; and
   a second conductor unit for connecting electrically said contact pads of said second semiconductor chip and said second circuit traces.

3. The semiconductor chip module as claimed in claim 2, wherein:
   said second dielectric tape member bonds adhesively said pad mounting surface of said second semiconductor chip on the other one of said first and second surfaces of said chip-mounting member, and is formed with a plurality of holes at positions registered with said contact pads of said second semiconductor; and
   said second conductor unit includes a plurality of conductive contact balls that are received in said holes in said second dielectric tape member to establish electrical connection between said contact pads of said second semiconductor and said second circuit traces.

4. The semiconductor chip module as claimed in claim 1, wherein said first semiconductor has a peripheral portion that is provided with an epoxy resin layer to strengthen bonding of said first semiconductor chip with said same one of said first and second surfaces of said chip-mounting member.

5. The semiconductor chip module as claimed in claim 1, wherein said first semiconductor chip has a heat dissipating surface that is opposite to said pad mounting surface and that has a heat dissipating plate secured thereon.

6. A semiconductor chip module stack, comprising:
   upper and lower semiconductor chip modules, each including
      a chip-mounting member having upper and lower surfaces, a set of circuit traces, and a plurality of plated through holes that extend through said upper and lower surfaces and that are connected to said circuit traces,
      a semiconductor chip having a pad mounting surface with a plurality of contact pads provided thereon, a dielectric tape member for bonding adhesively said semiconductor chip on said chip-mounting member, a conductor unit for connecting electrically said contact pads of said semiconductor chip and said circuit traces, and a plurality of solder balls disposed on said lower surface of said chip-mounting member, each of said solder balls being aligned with and being connected to a respective one of said plated through holes in said chip-mounting member;

wherein said circuit traces and said semiconductor chip are disposed on a same one of said upper and lower surfaces of said chip-mounting member;

said dielectric tape member bonds adhesively said pad mounting surface of said semiconductor chip on said same one of said upper and lower surfaces of said chip-mounting member, and is formed with a plurality of holes at positions registered with said contact pads of said semiconductor chip;

said conductor unit includes a plurality of conductive contact balls that are disposed within said holes in said dielectric tape member to establish electrical connection between said contact pads of said semiconductor chip and said circuit traces; and said solder balls of said upper semiconductor chip module are aligned with and are connected to said plated through holes in said chip-mounting member of said lower semiconductor chip module at said upper surface of said chip-mounting member of said lower semiconductor chip module.

7. A semiconductor chip module comprising:

a chip-mounting member having opposite first and second surfaces, a set of first circuit traces, a plurality of plated through holes that extend through said first and second surfaces and that are connected to said first circuit traces, and a set of second circuit traces accessible from the other one of said first and second surfaces opposite to said first circuit traces and connected to said plated through holes;

a first semiconductor chip having a pad mounting surface with a plurality of contact pads provided thereon;

a first dielectric tape member for bonding adhesively said first semiconductor chip on said chip-mounting member;

a first conductor unit for connecting electrically said contact pads of said first semiconductor chip and said first circuit traces;

a second semiconductor chip having a pad mounting surface with a plurality of contact pads provided thereon;

a second dielectric tape member for bonding adhesively said second semiconductor chip on said chip-mounting member;

a second conductor unit for connecting electrically said contact pads of said second semiconductor chip and said second circuit traces; and a plurality of solder balls disposed on one of said first and second surfaces of said chip-mounting member, each of said solder balls being aligned with and being connected to a respective one of said plated through holes in said chip-mounting member;

wherein:

said first circuit traces and said first semiconductor chip are disposed on a same one of said first and second surfaces of said chip-mounting member;

said first dielectric tape member bonds adhesively said pad mounting surface of said first semiconductor chip on said same one of said first and second surfaces of said chip-mounting member, and is formed with a plurality of holes at positions registered with said contact pads of said first semiconductor chip;

said first conductor unit includes a plurality of conductive contact balls that are disposed within said holes in said first dielectric tape member to establish electrical connection between said contact pads of said first semiconductor chip and said first circuit traces;

said second dielectric tape member bonds adhesively said pad mounting surface of said second semiconductor chip on the other one of said first and second surfaces of said chip-mounting member, and is formed with a plurality of holes at positions registered with said contact pads of said second semiconductor chip; and said second conductor unit includes a plurality of conductive contact balls that are disposed within said holes in said second dielectric tape member to establish electrical connection between said contact pads of said second semiconductor chip and said second circuit traces.

8. The semiconductor chip module as claimed in claim 7, wherein each of said solder balls being connected to one of said first and second circuit traces.

* * * * *